(12) United States Patent
Itabashi (10) Patent No.: US 12,322,925 B2
(45) Date of Patent: Jun. 3, 2025

(54) OPTICAL SEMICONDUCTOR MODULE

(71) Applicant: SUMITOMO ELECTRIC INDUSTRIES, LTD., Osaka (JP)

(72) Inventor: Naoki Itabashi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 734 days.

(21) Appl. No.: 17/521,600

(22) Filed: Nov. 8, 2021

(65) Prior Publication Data

US 2022/0149590 A1 May 12, 2022

(30) Foreign Application Priority Data

Nov. 9, 2020 (JP) ................................. 2020-186792

(51) Int. Cl.
*H01S 5/02216* (2021.01)
*H01S 5/02325* (2021.01)
*H01S 5/02345* (2021.01)
*H01S 5/024* (2006.01)

(52) U.S. Cl.
CPC ...... *H01S 5/02216* (2013.01); *H01S 5/02325* (2021.01); *H01S 5/02345* (2021.01); *H01S 5/02415* (2013.01)

(58) Field of Classification Search
CPC ............. H01S 5/02216; H01S 5/02325; H01S 5/02415
See application file for complete search history.

(56) References Cited

U.S. PATENT DOCUMENTS 6,740,963 B2 * 5/2004 Kaneko .................. H01S 5/042
372/36
2003/0001081 A1 1/2003 Kaneko et al.
(Continued)

FOREIGN PATENT DOCUMENTS

| JP | H4-337688 | 11/1992 |
| JP | 2002-335034 | 11/2002 |
| JP | 2016-180779 | 10/2016 |

OTHER PUBLICATIONS

Notice of Reasons for Refusal mailed relative to Japanese Patent Application No. 2020-186792, May 21, 2024 (3 pages Japanese, 3 pages English translation).

*Primary Examiner* — Michael Carter
(74) *Attorney, Agent, or Firm* — Smith, Gambrell & Russell, LLP (57) ABSTRACT

An optical semiconductor module according to an embodiment includes a housing; a temperature control element having a temperature control plane; a first board mounted on the temperature control plane; a semiconductor laser device mounted on the second side of the first board; a second board mounted on the second side of the first board, the second board having a third side and a fourth side, the fourth side including a wiring pattern, the wiring pattern being electrically connected with the housing via a first bonding wire and electrically connected to the semiconductor laser device via a second bonding wire, the second board having a second thermal conductivity smaller than the first thermal conductivity. The housing is configured to accommodate the temperature control element, the first board, the second board, and the semiconductor laser device.

4 Claims, 6 Drawing Sheets

(56) References Cited

U.S. PATENT DOCUMENTS

| | | | |
|---|---|---|---|
| 2003/0112500 A1* | 6/2003 | Miki | H01S 5/02216 359/344 |
| 2009/0010652 A1* | 1/2009 | Iwafuji | H01L 25/167 398/135 |
| 2019/0052049 A1* | 2/2019 | Sato | H01S 5/4012 |

* cited by examiner

OPTICAL SEMICONDUCTOR MODULE

TECHNICAL FIELD

The present disclosure relates to an optical semiconductor module.

The application is based upon and claims the benefit of priority from Japanese Patent Application No. 2020-186792, filed Nov. 9, 2020, the entire contents of which are incorporated herein by reference.

BACKGROUND

Japanese Unexamined Patent Publication No. 2016-180779 discloses an optical circuit of a module which is a box-type TOSA module. The module includes a thin plate called a subcarrier in an internal portion thereof. A wiring pattern is formed on the subcarrier by metal plating or vapor deposition on a dielectric material. A laser diode, an optical modulator, a resistor, and a capacitor are mounted on the subcarrier. The module further includes a carrier on which the subcarrier is mounted, and a thermo-electric cooling element (thermo-electric cooler (TEC)) is mounted under the carrier. The carrier and the TEC are accommodated in the housing of the module. Heat generated by the elements on the subcarrier is absorbed by the TEC, and this heat is exhausted from a lower portion of the housing. The module includes wirings for supplying a modulated electric signal that penetrates from the outside to the inside of the housing. The wirings for supplying the modulated electric signal and the subcarrier are electrically connected to each other via a wire-shaped gold line or a ribbon-shaped gold line.

SUMMARY

An optical semiconductor module according to the present disclosure includes a housing; a temperature control element having a temperature control plane, the temperature control element being configured to cool or heat the temperature control plane; a first board mounted on the temperature control plane, the first board having a first side and a second side reverse to the first side, the first side having a surface contact with the temperature control plane, the first board having a first thermal conductivity; a semiconductor laser device mounted on the second side of the first board; a second board mounted on the second side of the first board, the second board having a third side and a fourth side reverse to the third side, the third side being fixed to the second side of the first board, the fourth side including a wiring pattern, the wiring pattern being electrically connected with the housing via a first bonding wire and electrically connected to the semiconductor laser device via a second bonding wire, the second board having a second thermal conductivity smaller than the first thermal conductivity. The housing is configured to accommodate the temperature control element, the first board, the second board, and the semiconductor laser device.

DETAILED DESCRIPTION

Specific examples of an optical semiconductor module according to an embodiment of the present disclosure will be described with reference to the drawings. It is noted that the present invention is not limited to these examples, and is indicated by the scope of claims and is intended to include all modifications within the scope equivalent to the scope of claims. In the description of the drawings, the same or corresponding elements are denoted by the same reference numerals, and duplicate description will be omitted as appropriate. The drawings are partially simplified or exaggerated for the ease of understanding, and the dimensional ratios and the like are not limited to those described in the drawings.

Figure 1:
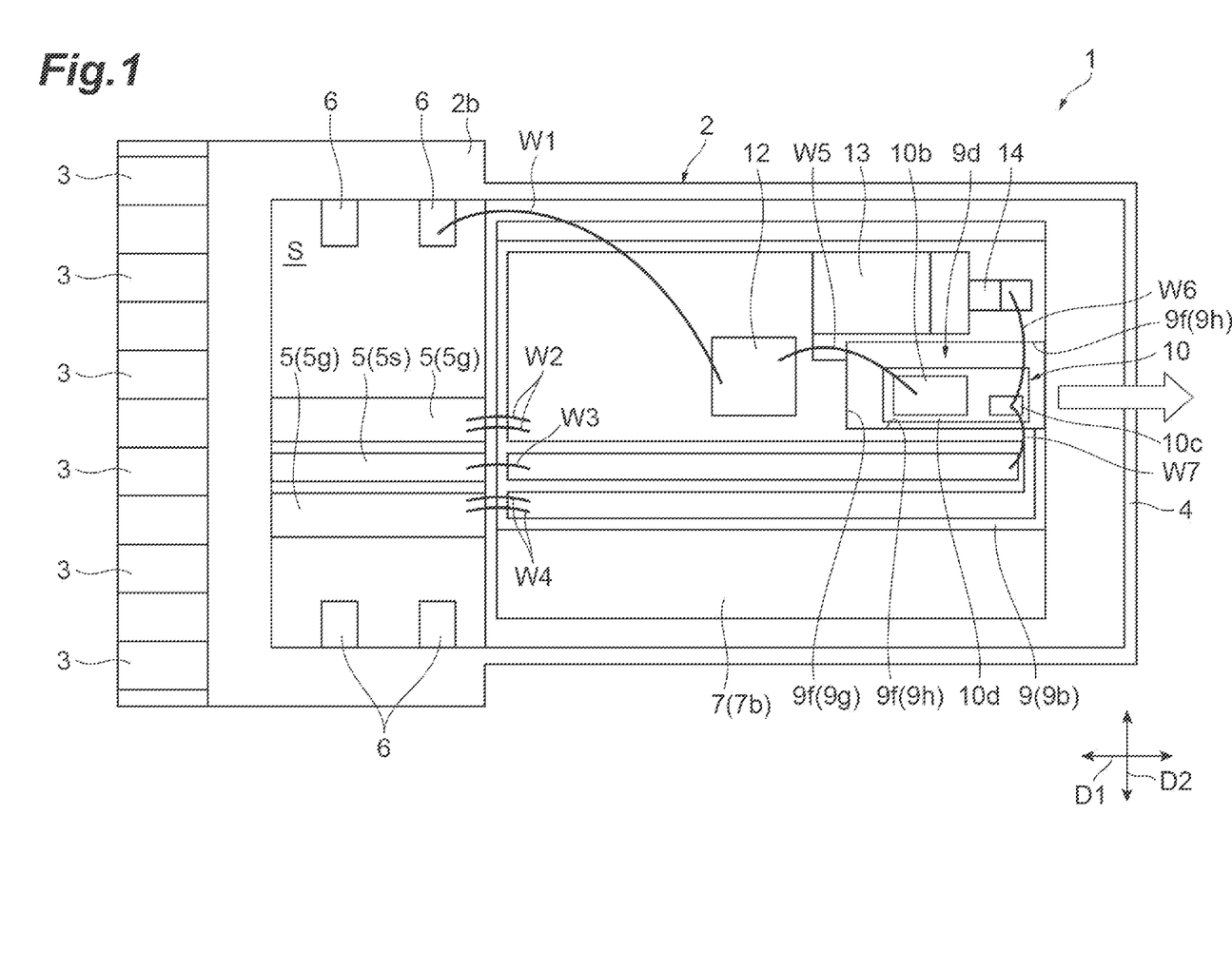
FIG. 1 is a plan view schematically illustrating an internal structure of an optical semiconductor module according to an embodiment.

FIG. 1 is a plan view schematically illustrating an internal structure of an optical semiconductor module 1 according to an embodiment. The optical semiconductor module 1 includes, for example, a rectangular housing 2 and external terminals 3 provided at one end of the housing 2 in a direction D1 which is the longitudinal direction of the housing 2. The external terminals 3 are aligned at one end of the housing 2 in the direction D1 along a direction D2 which is the width direction of the housing 2. The direction D2 is a direction intersecting the direction D1. The external terminals 3 include, for example, a terminal that receives a high-speed electric signal from the outside, a terminal that receives a drive current of a laser diode, a terminal that receives a drive current of a TEC, a monitor terminal for detecting a temperature of the laser diode, and a terminal that supplies a ground potential (reference potential). As signals exchanged with the outside via the external terminals 3, there are high-speed signals and low-speed signals. The low-speed signal includes a DC signal. The housing 2 has an inner wall 2b that defines an internal space S of the housing 2. An optical output unit 4 that outputs a light beam L (optical signal) is provided at an end of the housing 2 opposite to the external terminal 3 in the direction D1.

Figure 2:
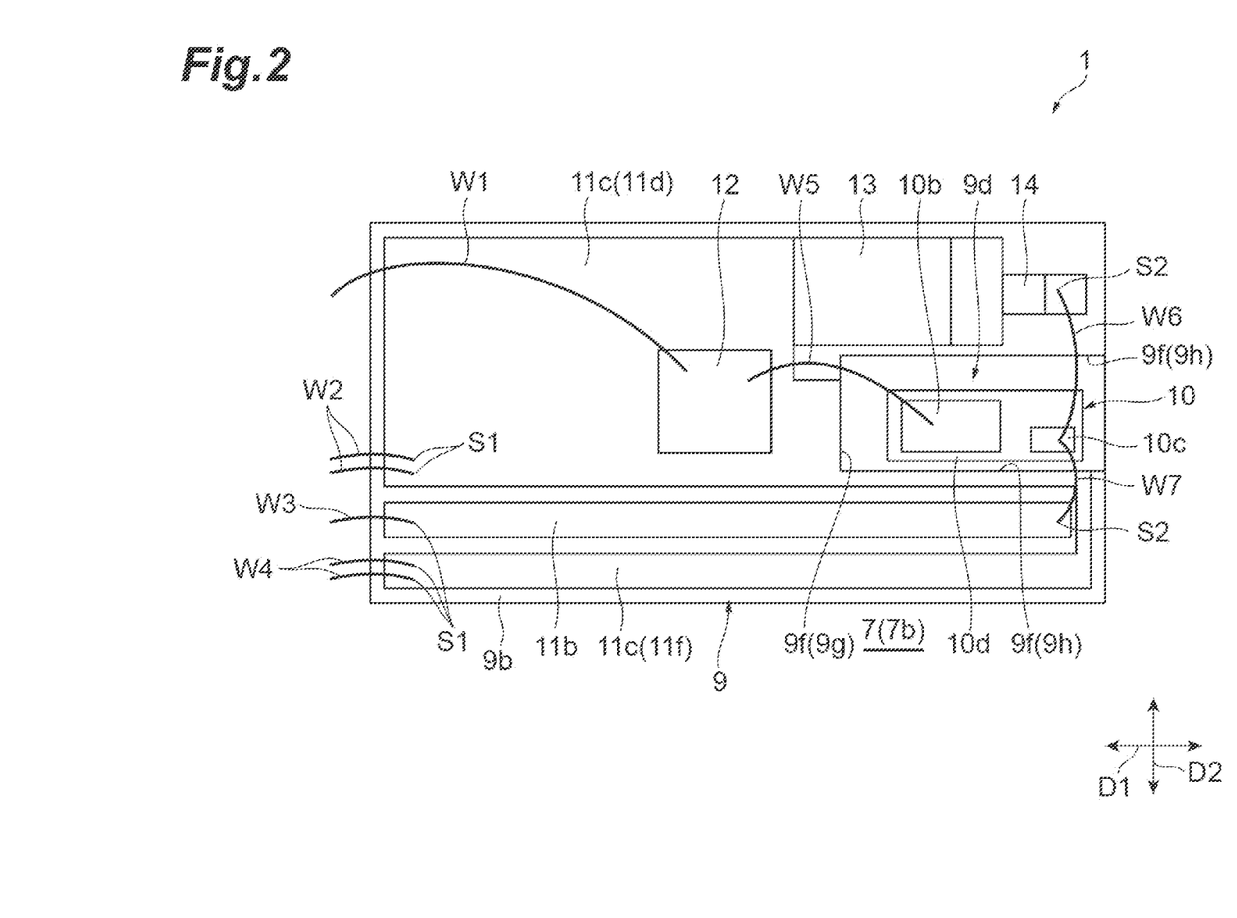
FIG. 2 is a plan view schematically illustrating a semiconductor laser element, a second substrate, and a wire of the optical semiconductor module.
Figure 3:
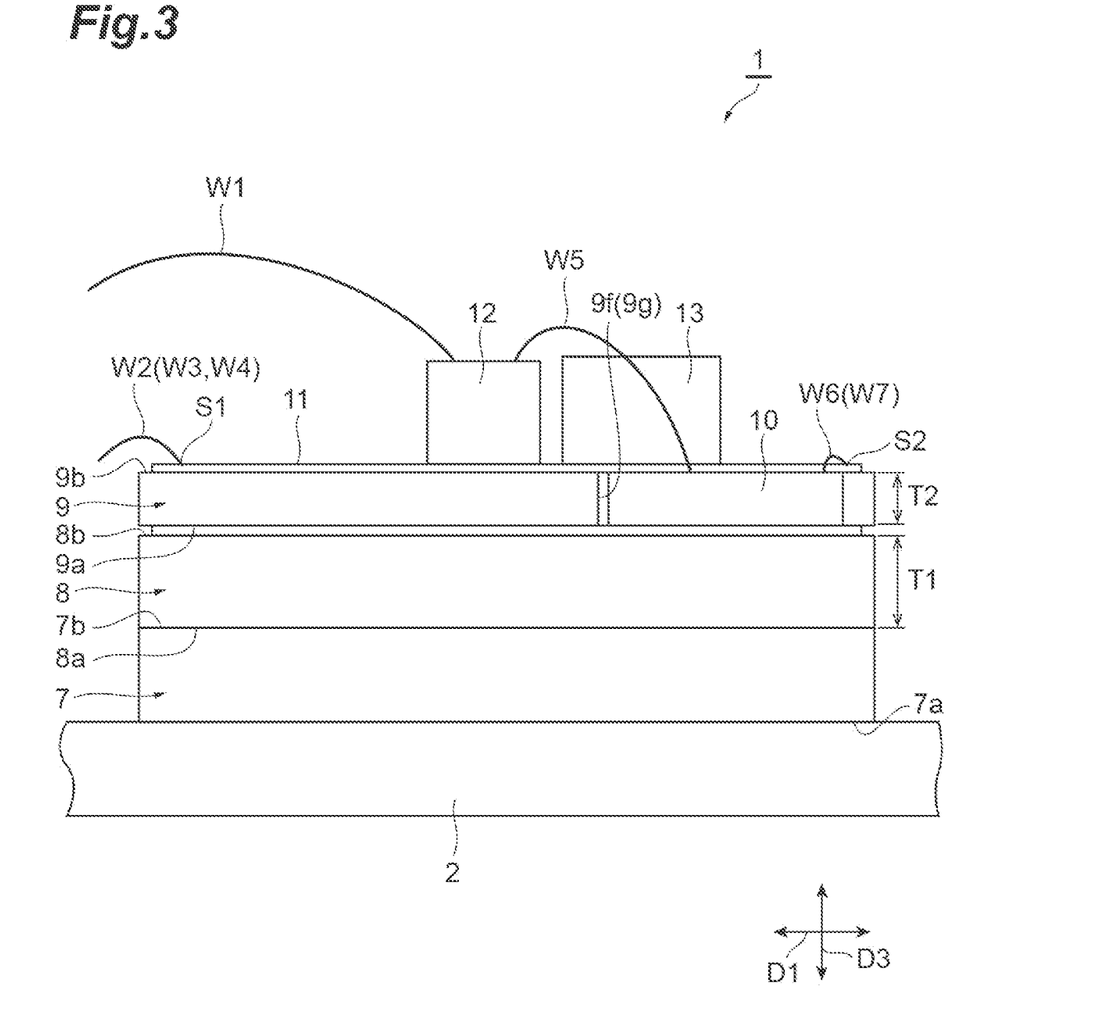
FIG. 3 is a side view schematically illustrating a temperature control element, a first substrate, a second substrate, a semiconductor laser element, and a wire of the optical semiconductor module.

The optical semiconductor module 1 includes, for example, a transmission line 5, a pad 6 which is a DC pad, and a thermo-electric cooler (TEC) 7 which is a temperature control element in the internal space S of the housing 2. FIG. 2 is a schematic plan view in which an upper structure of the TEC 7 is enlarged. FIG. 3 is a side view schematically illustrating the upper structure of the TEC 7. As illustrated in FIGS. 2 and 3, the optical semiconductor module 1 includes the TEC 7, a first substrate 8 (a first board) which is an aluminum nitride (AlN) substrate mounted on the TEC 7, a second substrate 9 (a second board) which is a quartz substrate mounted on the first substrate 8, and a semiconductor laser element 10 (semiconductor laser device). The transmission line 5 and the pads 6 are formed on an inner surface of the housing 2. The transmission line 5 and the pads 6 are connected to the external terminals 3 by wirings penetrating the inner wall 2b. The wirings connecting the transmission line 5 and the pads 6 to the external terminals 3 are formed, for example, by metal plating or vapor deposition. The transmission line 5 includes signal wirings 5s extending in one direction at a certain distance from ground wirings 5g running in parallel.

The first substrate 8 is a high thermal conductive substrate having a thermal conductivity higher than that of the second substrate 9. The second substrate 9 is a low thermal conductivity substrate having a thermal conductivity lower than that of the first substrate 8. A thickness T1 of the first substrate 8 is, for example, 600 µm or less, and a thickness T2 of the second substrate 9 is 50 µm or more. When the first substrate 8 is an AlN substrate made of AlN and the second substrate 9 is a quartz substrate made of quartz, for example, the thickness T1 of the AlN substrate 8 is 250 µm, and the thickness T2 of the quartz substrate 9 is 150 µm. For example, the thermal conductivity of the AlN substrate 8 is 170 W/m·k (the thermal resistance of the AlN substrate 8 is $1.47 \times 10^{-6}$ [m²·K/W] when the thickness is 250 µm), and the thermal conductivity of the quartz substrate 9 is 1.48 W/m·k (the thermal resistance of the quartz substrate 9 is $1.01 \times 10^{-4}$ [m²·K/W] when the thickness is 150 µm). The thermal conductivity of the AlN substrate 8 is 100 times or more of the thermal conductivity of the quartz substrate 9. As an example, the thermal resistance of the AlN substrate 8 is 1/50 or less of the thermal resistance of the quartz substrate 9.

For example, the AlN substrate 8 and the quartz substrate 9 are mounted on the TEC 7 in this order along a direction D3, which is the height direction. The direction D3 is a direction intersecting direction D1 and direction D2. The housing 2 accommodates the TEC 7, the AlN substrate 8, the quartz substrate 9, and the semiconductor laser element 10 in the internal space S. The TEC 7 has a heat sink surface 7a and a temperature control surface 7b. The TEC 7 is mounted on the housing 2 with the heat sink surface 7a in contact with the housing 2. The temperature control surface 7b is located opposite to the heat sink surface 7a in the direction D3. For example, the heat sink surface 7a and the temperature control surface 7b are planes parallel to the directions D1 and D2. The AlN substrate 8 is mounted on the temperature control surface 7b in contact with the temperature control surface 7b. The AlN substrate 8 has a first surface 8a which is a lower surface and a second surface 8b (a second side) which is an upper surface. The first surface 8a is in surface contact with the temperature control surface 7b. The second surface 8b is a reverse surface of the first surface 8a. The AlN substrate 8 has the second surface 8b opposite to the TEC 7, and the quartz substrate 9 and the semiconductor laser element 10 are mounted on the second surface 8b. The quartz substrate 9 is juxtaposed with the semiconductor laser element 10 on the second surface 8b. The semiconductor laser element 10 is, for example, an electric field absorption type modulator integrated laser (electro-absorption modulator integrated laser (EML)). For example, the semiconductor laser element 10 includes a laser diode 10b and a modulator 10c. For example, when a predetermined current is allowed to flow through the TEC 7, heat is absorbed in the temperature control surface 7b, and the heat amount absorbed is exhausted from the heat sink surface. At this time, the semiconductor laser element 10 is cooled via the AlN substrate 8. For example, when a current is allowed to flow through the TEC 7 in a direction opposite to the predetermined current, heat is absorbed on the heat sink surface 7a, and the heat amount absorbed is exhausted from the temperature control surface 7b. At this time, the semiconductor laser element 10 is heated via the AlN substrate 8. By allowing the thermal resistance of the AlN substrate to be low, it is possible to efficiently perform heating and cooling of the semiconductor laser element 10 by the TEC 7.

The quartz substrate 9 is formed so as to include, for example, a coplanar waveguide. The quartz substrate 9 has a third surface 9a which is the lower surface and a fourth surface 9b (a four side) which is the upper surface. The third surface 9a faces the AlN substrate. The fourth surface 9b is reverse surface of the third surface 9a. The quartz substrate 9 has a wiring 11 on the fourth surface 9b opposite to the AlN substrate 8. The fourth surface 9b is, for example, a plane parallel to the direction D1 and the direction D2. As an example, the quartz substrate 9 may be transparent. The wiring 11 includes a high-frequency wiring 11b extending in one direction while maintaining a constant distance from aground wiring 11c running in parallel. For example, the ground wiring 11c includes a first ground wiring portion 11d on which the die 12, the chip 13 and the resistor 14 are mounted and a second ground wiring portion 11f. The second ground wiring portion 11f is located on the opposite side of the first ground wiring portion 11d as viewed from the high-frequency wiring 11b. In other words, the high-frequency wiring 11b is disposed between the first ground wiring portion 11d and the second ground wiring portion 11f in the direction D2. It is noted that the first ground wiring portion 11d and the second ground wiring portion 11f are connected to each other between the high-frequency wiring 11b and the optical output unit. The high-frequency wiring 11b extends, for example, from one end of the quartz substrate on the external terminal 3 side toward the other end of the quartz substrate on the optical output unit side in the longitudinal direction D1 of the quartz substrate 9. The high-frequency wiring 11b extends in the direction D1 while maintaining a constant distance from the ground wiring 11c. The coplanar waveguide is formed by the high-frequency wiring 11b extending on the fourth surface 9b while maintaining a constant distance from the adjacent ground wiring 11c. In the quartz substrate 9, a microstrip line may be formed instead of the coplanar waveguide. The microstrip line will be described later. It is noted that, similar to the high-frequency wiring 11b, the ground wiring 11c may not be the wiring extending in one direction and but may be a wide wiring pattern. The die 12 is, for example, the die capacitor. The die capacitor has flat electrodes parallel to each other. One electrode is connected to the fourth surface 9b of the quartz substrate 9. A wire W1 is connected to the other electrode. The die capacitor can store charges between two electrodes.

The wire W1, a wire W2, a wire W3, and a wire W4 extend from the die 12, the first ground wiring portion 11d, the high-frequency wiring 11b, and the second ground wiring portion 11f, respectively. For example, the optical semiconductor module 1 further connects a wire W5 connecting the die 12 and the laser diode 10b to each other, a wire W6 connecting one end of the resistor 14 and the modulator 10c to each other, and a wire W7 connecting the high-frequency wiring 11b and the modulator 10c to each other. The diameters of the wires W1, W2, W3, W4, W5, W6, and W7 are, for example, 18 µm, 25 µm, or 50 µm. The diameters of the wires W1, W2, W3, W4, W5, W6, and W7 may all have the same value or may be different from each other. The wires W1, W2, W3, W4, W5, W6, and W7 may not be bonding wires but may be ribbon wires. The ribbon wire has a flat cross section rather than a circular cross section of, for example, a bonding wire. For example, in the ribbon wire, the lateral width of the cross section is twice or more of a thickness of the cross section.

The wire W2, the wire W3, and the wire W4 correspond to the first wire (first bonding wire) connecting the wiring 11 and the housing 2 to each other. For example, the wire W2, the wire W3, and the wire W4 are connected to the transmission line 5 of the housing 2. The wire W7 corresponds to the second wire (second bonding wire) connecting the wiring 11 and the semiconductor laser element 10 to each other. For example, the distance (shortest distance) between a connection point St on the fourth surface 9b of the first wire (the wire W2, the wire W3, and the wire W4) and the semiconductor laser element 10 is longer than the distance (shortest distance) between a connection point S2 on the fourth surface 9b of the second wire (the wire W7) and the semiconductor laser element 10. The connection point St is provided in the high-frequency wiring 11b or the ground wiring 11c. More specifically, the connection point St is provided near one end of the quartz substrate on the external terminal 3 side. The connection point S2 is provided in the high-frequency wiring 11b. More specifically, the connection point S2 is provided near the other end of the quartz substrate on the optical output side. For example, in direction D1, the connection point S1 is located between the external terminal 3 and the connection point S2. Further, in the direction D1, the connection point S2 is located between the connection point S1 and the optical output unit.

For example, both the second surface 8b of the AlN substrate 8 and the third surface 9a of the quartz substrate 9 are metallized. The semiconductor laser element 10 is mounted on the metallized second surface 8b. The quartz substrate 9 has, for example, an exposed portion (a hollowed part) 9d that exposes a surface 10d of the semiconductor laser element 10 on the opposite side of the AlN substrate 8. The shape of the quartz substrate 9 is U-shaped as viewed from the direction D3, which is the stacking direction of, for example, the AlN substrate 8 and the quartz substrate 9. Specifically, the exposed portion 9d is formed so that a portion of one side of the quartz substrate 9 on the optical output unit 4 side is recessed in the direction D1. The exposed portion 9d is formed by, for example, a side surface 9f facing the semiconductor laser element 10. The side surface 9f is, for example, metallized. Accordingly, by electrically connecting the ground wiring 11c of the quartz substrate 9 to the ground wiring of the second surface 8b of the AlN substrate 8, a high frequency return path can be formed. For example, the side surface 9f includes a first side surface 9g facing the semiconductor laser element 10 along the direction D1 and a pair of second side surfaces 9h facing the semiconductor laser element 10 along the direction D2. For example, by providing the ground wiring on the second surface 8b of the lower layer of the high-frequency wiring 11b in this manner, the microstrip line can be formed for the high-frequency wiring 11b. For example, the first side surface 9g is a plane perpendicular to the direction D1. For example, the second side surface 9h is a plane perpendicular to the direction D2. As viewed in a plan view from the direction D3, the semiconductor laser element 10 is surrounded by a first side surface 9g and a pair of second side surfaces 9h in three of the four surrounding directions, and the semiconductor laser element 10 is open (in a state where there is no obstacle) in only one of the four directions. That is, as viewed in a plan view from the direction D3, the semiconductor laser element 10 is disposed so as to be included in the exposed portion of the quartz substrate 9. The semiconductor laser element 10 emits a beam in one direction open during operation.

Figure 4:
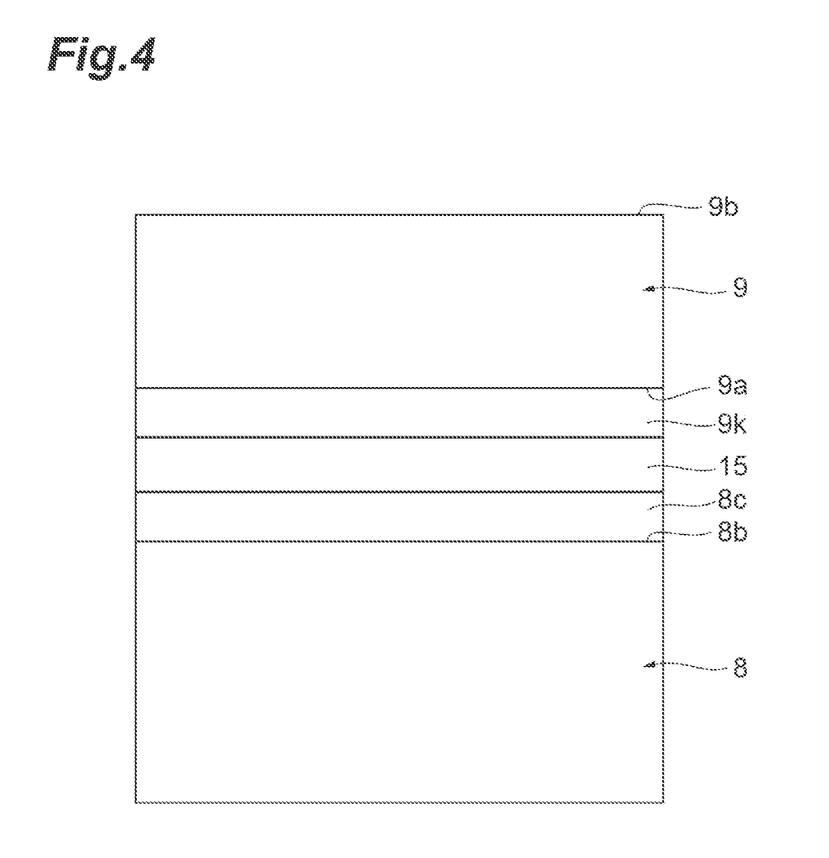
FIG. 4 is a side view illustrating an example of a layer structure between the first substrate and the second substrate.

FIG. 4 is a diagram illustrating an example of the layer structure of the AlN substrate 8 and the quartz substrate 9. As illustrated in FIG. 4, for example, the AlN substrate 8 may have a metallized portion 8c on the second surface 8b. The quartz substrate 9 may have a metallized portion 9k on the third surface 9a. The quartz substrate 9 may be fixed to the AlN substrate 8 with the adhesive 15. The adhesive 15 may be made of, for example, gold tin (AuSn). In this case, the adhesive 15 is interposed between the metallized portion 8c of the AlN substrate 8 and the metallized portion 9k of the quartz substrate 9. The metallized portion 8c and the metallized portion 9k are formed by, for example, metal plating or vapor deposition. As described above, by connecting the metallized portion 8c to the ground wiring 11c via the metallized side surface 9f, the metallized portion 8c can be provided as a ground wiring (ground layer) with respect to the high-frequency wiring 11b.

Figure 5:
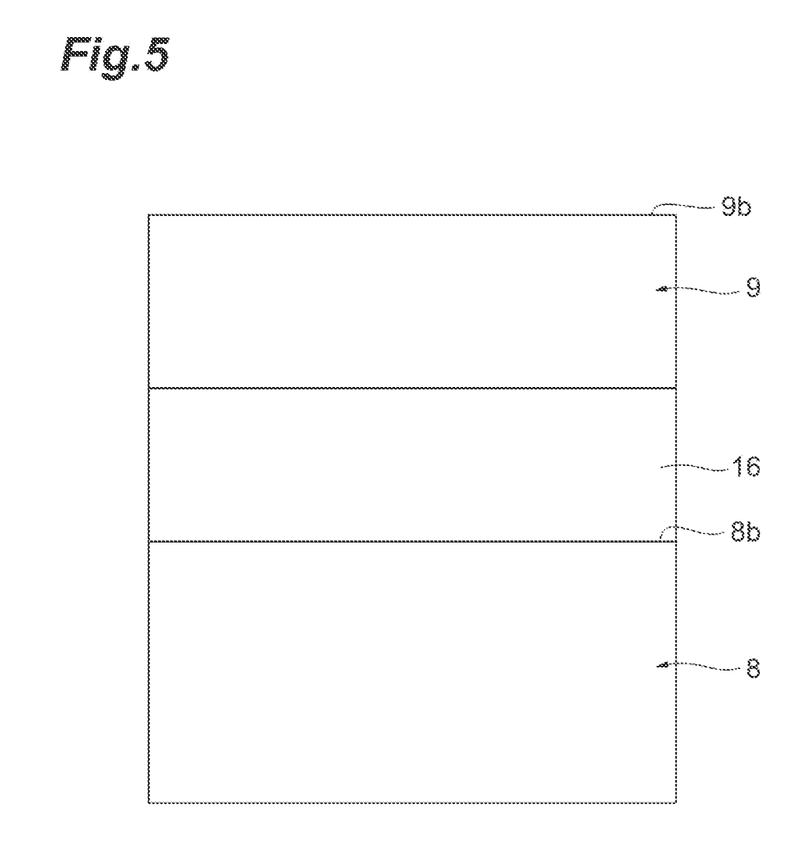
FIG. 5 is a side view illustrating another example of the layer structure between the first substrate and the second substrate.

FIG. 5 is a diagram illustrating another example of the layer structure of the AlN substrate 8 and the quartz substrate 9. As illustrated in FIG. 5, at least one of the AlN substrate 8 and the quartz substrate 9 may not have the metallized portion. The quartz substrate 9 may be directly fixed to the AlN substrate 8 by an adhesive 16. For example, the adhesive 16 may be made of a silver (Ag) paste or an ultraviolet (UV) curable resin.

Next, the function and effect obtained from the optical semiconductor module 1 according to the present embodiment will be described. In the optical semiconductor module 1, as illustrated in FIG. 3, the TEC 7 has the temperature control surface 7b, and the AlN substrate 8 is mounted on the TEC 7 so as to be in contact with the temperature control surface 7b. The quartz substrate 9 is mounted on the second surface 8b of the AlN substrate 8 opposite to the TEC 7. The TEC 7, the AlN substrate 8, the quartz substrate 9, and the semiconductor laser element 10 are accommodated in the internal space S of the housing 2. The wiring 11 is formed on the fourth surface 9b of the quartz substrate 9 opposite to the AlN substrate 8. The TEC 7 is mounted so that the heat sink surface 7a opposite to the temperature control surface 7b is in contact with the inner surface of the housing 2. For example, the inner surface of the housing 2 in contact with the heat sink surface 7a of the TEC 7 is made of a material having a good thermal conductivity such as a metal material.

Each of the wire W2, the wire W3, and the wire W4 connects the wiring 11 formed on the fourth surface 9b of the quartz substrate 9 and the housing 2 to each other. The wire W7 connects the wiring 11 and the semiconductor laser element 10 to each other. The thermal conductivity of the quartz substrate 9 is lower than the thermal conductivity of the AlN substrate 8. That is, the thermal resistance of the quartz substrate 9 is higher than the thermal resistance of the AlN substrate 8. Therefore, since the thermal resistance between the fourth surface 9b of the quartz substrate 9 and the second surface 8b of the AlN substrate 8, which are connected to the housing 2 via the wire W2, the wire W3, and the wire W4, is higher than the thermal resistance of the AlN substrate 8, the thermal resistance between the AlN substrate 8 and the housing 2 can be allowed to be higher. For example, the path transferring the heat from the housing 2 to the AlN substrate 8 is a path that passes through the wires W2, W3, and W4, the wiring 11, the wires W6 and W7, and the semiconductor laser element 10 in the direction D3. As another path, there is a path that passes through the wire W1, the upper surface of the die 12, the wire W5, and the semiconductor laser element 10 in the direction D3. However, while the wire W1 is, for example, one bonding wire, the wires W2, W3, and W4 are configured with five bonding wires. Therefore, the heat amount flowing in and out through the wire W1 is ⅕ or less of the heat amount flowing out through the wires W2, W3, and W4. As described above, since the inflow and outflow of the heat between the semiconductor laser element 10 and the housing 2 is mainly performed via the wires W6 and W7, the influence of the TEC 7 on the heating and cooling of the semiconductor laser element 10 can be suppressed.

Figure 6:
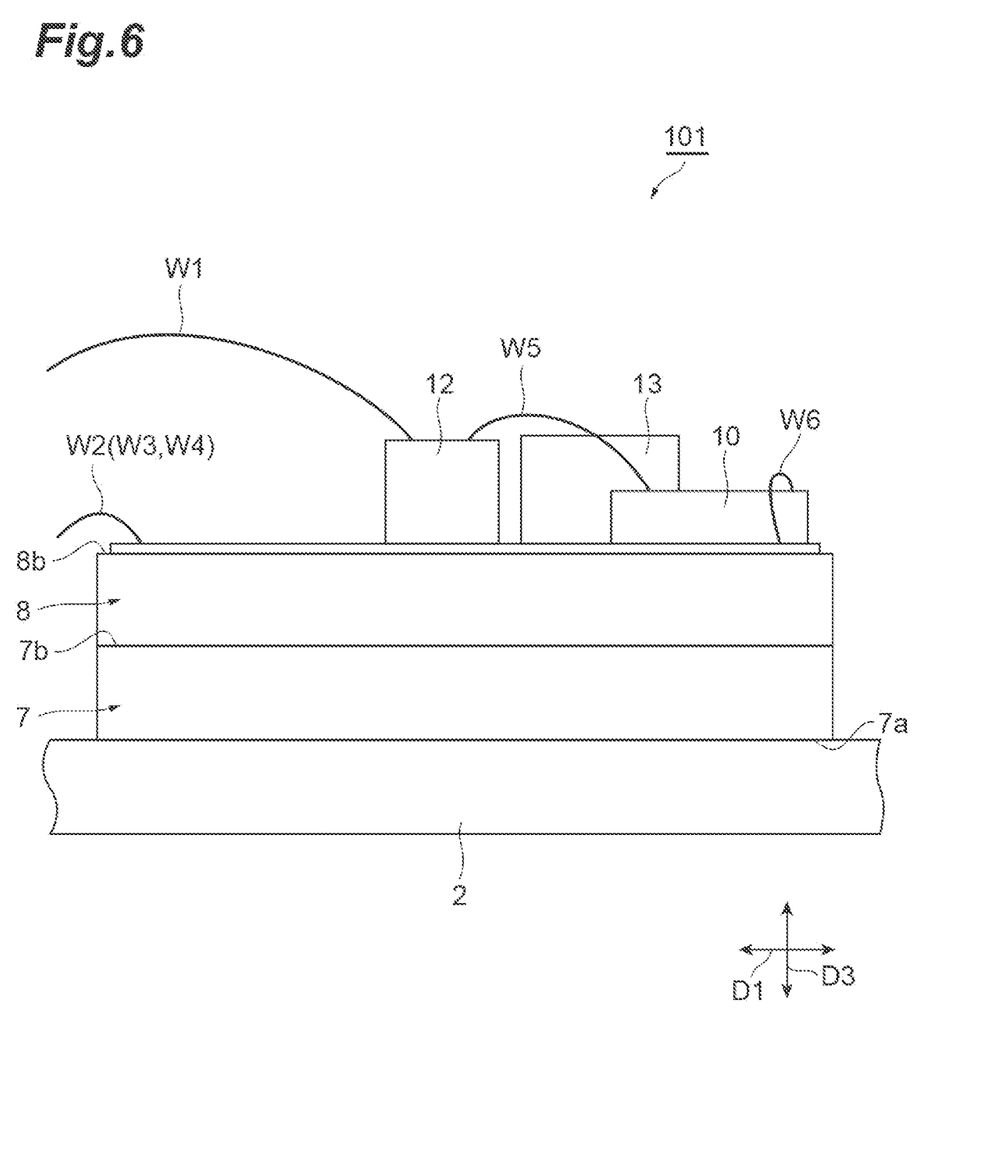
FIG. 6 is a side view schematically illustrating a temperature control element, a substrate, and a semiconductor laser element of an optical semiconductor module according to a comparative example.

FIG. 6 illustrates an optical semiconductor module 101 according to the comparative example. As compared with the optical semiconductor module 1 according to the embodiment illustrated in FIG. 1, the optical semiconductor module 101 does not have the quartz substrate 9, and the semiconductor laser element 10, the die 12, and the chip 13 are mounted on the second surface 8b of the AlN substrate 8. In this case, since the wires W2 (W3 and W4) extending from the housing 2 are thermally connected to the TEC 7 via the AlN substrate 8, the inflow and outflow of the heat to the temperature control surface 7b of the TEC 7 via the AlN substrate 8 having a large thermal conductivity from the housing 2 cannot be suppressed. For example, when the semiconductor laser element 10 is cooled by setting the temperature of the temperature control surface 7b of the TEC 7 to be lower than the temperature outside the optical semiconductor module 101, heat flows in from the housing 2 via the wire W2 (W3 and W4), and thus, the TEC 7 requires extra power to dissipate their heat. In addition, for example, when the semiconductor laser element 10 is heated by setting the temperature of the temperature control surface 7b of the TEC 7 to be higher than the temperature of the outside of the optical semiconductor module 101, the heat flows out to the housing 2 via the wire W2 (W3 and W4), and thus, the TEC 7 needs extra power to supply the heat. As described above, the inflow and outflow of the heat between the semiconductor laser element 10 and the housing 2 via the wires W2 (W3 and W4) increases the power consumption of the TEC 7 and decreases the efficiency of the temperature control of the semiconductor laser element 10.

In contrast, as illustrated in FIG. 3, when the wires W2 (W3 and W4) extending from the housing 2 are thermally connected to the temperature control surface 7b of the TEC 7 via the quartz substrate 9 and the AlN substrate 8, by allowing the thermal conductivity of the quartz substrate 9 to be 1/100 or less of the thermal conductivity of the AlN substrate 8, the inflow and outflow of the heat between the housing 2 and the temperature control surface 7b of the TEC 7 can be significantly suppressed as compared with the comparative example. Therefore, an increase in the power consumption of the TEC 7 can be suppressed, and the temperature control of the semiconductor laser element 10 can be efficiently performed. For example, in FIG. 6, when the semiconductor laser element 10 is cooled by allowing the heat generated by the semiconductor laser element 10 to be absorbed by the temperature control surface 7b of the TEC 7, if the thermal resistance between the housing 2 and the temperature control surface 7b is small, (when the temperature of the housing is higher than a target temperature of the semiconductor laser element), a larger current is required to flow through the TEC 7 in order to absorb the heat flowing in from the housing 2. For example, in FIG. 3, when the heat generated by the semiconductor laser element 10 is absorbed by the temperature control surface 7b of the TEC 7 to cool the semiconductor laser element 10, the thermal resistance between the housing 2 and the temperature control surface 7b is large as compared with FIG. 6. For this reason, the heat amount flowing in from the housing 2 is significantly reduced, and the current required for the temperature control of the TEC 7 can be reduced. Accordingly, the efficiency (power efficiency) of the temperature control of the semiconductor laser element 10 can be improved.

As described above, the quartz substrate 9 is juxtaposed with the semiconductor laser element 10 on the second surface 8b. That is, the quartz substrate 9 and the semiconductor laser element 10 are juxtaposed on the second surface 8b of the AlN substrate 8 opposite to the TEC 7. Therefore, since the semiconductor laser element 10 is mounted on the second surface 8b of the AlN substrate 8 having a thermal conductivity 100 times or more higher than that of the quartz substrate 9, the temperature control (cooling and heating) of the semiconductor laser element 10 via the AlN substrate 8 by the TEC 7 can be performed more efficiently.

The quartz substrate 9 may be fixed to the AlN substrate 8 via the adhesive 15 or the adhesive 16. In this case, the quartz substrate 9 having a thermal conductivity smaller than that of the AlN substrate 8 can be fixed to the AlN substrate 8 via the adhesive 15 or the adhesive 16.

The distance between the connection point S1 on the fourth surface 9b of each of the wire W2, the wire W3, and the wire W4 and the semiconductor laser element 10 is longer than the distance between the connection point S2 on the fourth surface 9b of the wire W7 and the semiconductor laser element 10. Therefore, since the distance between the connection point S1 of each of the wire W2, the wire W3, and the wire W4 connected to the housing 2 and the semiconductor laser element 10 is longer than the distance between the connection point S2 of the wire W7 and the semiconductor laser element 10, the thermal resistance between the housing 2 and the temperature control surface 7b can be allowed to be much larger. Then, the inflow and outflow of the heat between the housing 2 and the temperature control surface 7b of the TEC 7 can be more reliably suppressed.

The thickness T1 of the AlN substrate 8 may be 600 μm or less, and the thickness T2 of the quartz substrate 9 may be 50 μm or more. In this case, since the thickness T1 of the AlN substrate 8 is 600 μm or less, the thermal resistance of the AlN substrate 8 with respect to the heat conduction along the direction D3 can be allowed to be smaller, and the temperature control of the semiconductor laser element 10 by the TEC 7 via the AlN substrate 8 can be more efficiently performed. By allowing the thickness T2 of the quartz substrate 9 to be 50 μm or more, the thermal resistance of the quartz substrate 9 with respect to heat conduction along the direction D3 can be allowed to be larger, and thus, the inflow and outflow of the heat with respect to the housing 2 via the quartz substrate 9 can be suppressed. Therefore, the temperature control of the semiconductor laser element 10 can be performed more efficiently. For example, when the thickness T1 of the AlN substrate 8 is 600 μm or less and the thickness T2 of the quartz substrate 9 is 50 μm or more, the thermal resistance between the housing 2 and the semiconductor laser element 10 can be surely allowed to higher than the thermal resistance between the semiconductor laser element 10 and the temperature control surface 7b. Accordingly, for example, it is possible to reduce the heat amount other than the heat amount by the heat generated by the semiconductor laser element 10 flowing into the temperature control surface 7b from the housing 2.

Heretofore, the embodiment of the optical semiconductor module according to the present disclosure has been described. However, the present invention is not limited to the above-described embodiments. That is, it is easily recognized by those skilled in the art that the present invention can be modified and changed in various forms within the scope of the spirit described in the claims. For example, in the above-described embodiment, an example where the die 12, the chip 13, and the resistor 14 are mounted on the wiring 11 has been described. However, the type and number of elements mounted on the wiring 11 are not limited to the above examples and can be changed as appropriate.

In the above-described embodiment, an example where the semiconductor laser element 10 is an EML has been described. However, the semiconductor laser element may be a semiconductor laser element other than EML. In the above-described embodiment, an example where the first substrate 8 is an AlN substrate and the second substrate 9 mounted on the first substrate 8 is a quartz substrate has been described. However, the material of the first substrate may be a material other than AlN. For example, the first substrate may be a metal plate made of a metal material. For example, the first substrate may be a copper plate. The thermal conductivity of copper is about 400 W/m·k, which is higher than the thermal conductivity of AlN. The first substrate may be a substrate (silicon nitride substrate) made of silicon nitride ($Si_3N_4$). The thermal conductivity of silicon nitride is, for example, 85 W/m·k. The second substrate may be made of alumina, glass epoxy, or polyimide. For example, the thermal conductivity of alumina is 32 W/m·k, which is ⅕ or less of the thermal conductivity of AlN. For example, the thermal conductivity of glass epoxy is about 0.5 W/m·k, which is even lower than the thermal conductivity of alumina. For example, in the case of polyimide, a material having a thermal conductivity lower than the thermal conductivity of glass epoxy can be selected. For example, when the silicon nitride substrate is used for the first substrate and alumina is used for the second substrate, the thermal conductivity of the first substrate is about 2.6 times the thermal conductivity of the second substrate. That is, the first substrate and the second substrate may be substrates other than the AlN substrate or the quartz substrate, and the materials of the first substrate and the second substrate are not particularly limited.

What is claimed is:

1. An optical semiconductor module comprising:
    a housing;
    a temperature control element having a temperature control plane, the temperature control element being configured to cool or heat the temperature control plane;
    a first board mounted on the temperature control plane, the first board having a first side and a second side reverse to the first side, the first side having a surface contact with the temperature control plane, the first board having a first thermal conductivity;
    a semiconductor laser device mounted on the second side of the first board; and
    a second board mounted on the second side of the first board, the second board having a third side and a fourth side reverse to the third side, the third side being fixed to the second side of the first board, the fourth side including a wiring pattern, the wiring pattern being electrically connected with the housing via a first bonding wire and electrically connected to the semiconductor laser device via a second bonding wire, the second board having a second thermal conductivity smaller than the first thermal conductivity,
    wherein the housing is configured to accommodate the temperature control element, the first board, the second board, and the semiconductor laser device,
    wherein the second board is juxtaposed with the semiconductor laser device on the second side of the first board, and
    wherein the second board has a hollowed part, and the semiconductor laser device is disposed within the hollowed part in a plan view from a direction perpendicular to the fourth side.

2. The optical semiconductor module according to claim 1, wherein the second board is fixed to the first board with an adhesive.

3. The optical semiconductor module according to claim 1, wherein a shortest distance between the semiconductor laser device and a connection point of the first bonding wire to the second board is longer than a shortest distance between the semiconductor laser device and a connection point of the second bonding wire to the second board.

4. The optical semiconductor module according to claim 1,
    wherein a thickness of the first board is 600 µm or less, and
    wherein a thickness of the second board is 50 µm or more.

* * * * *